(12) United States Patent
Pei

(10) Patent No.: US 8,337,620 B2
(45) Date of Patent: Dec. 25, 2012

(54) CRUCIBLE HAVING A MONITOR SYSTEM AND A COVER WITH A SLOT WHICH RECEIVES LIGHT FOR ILLUMINATING COATING MATERIAL

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 323 days.

(21) Appl. No.: 12/889,381

(22) Filed: Sep. 23, 2010

(65) Prior Publication Data

US 2012/0012056 A1 Jan. 19, 2012

(30) Foreign Application Priority Data

Jul. 16, 2010 (TW) ................................ 99123374 A

(51) Int. Cl.
*C23C 16/00* (2006.01)
*B05C 11/00* (2006.01)
*C23C 14/00* (2006.01)

(52) U.S. Cl. ................. 118/726; 118/723 EB; 118/667; 118/694; 204/298.25; 373/13; 422/557; 427/566

(58) Field of Classification Search .................. 118/726, 118/723 EB, 677; 373/13; 422/557; 423/344, 423/42; 250/492.3
See application file for complete search history.

(56) References Cited

U.S. PATENT DOCUMENTS

| | | | | |
|---|---|---|---|---|
| 3,664,942 A * | 5/1972 | Havas et al. | ............. | 204/192.33 |
| 5,273,102 A * | 12/1993 | Lillquist et al. | ............... | 164/452 |
| 6,527,866 B1 * | 3/2003 | Matijasevic et al. | .......... | 118/719 |
| 7,371,285 B2 * | 5/2008 | Rosenstein et al. | ........... | 118/715 |
| 7,439,208 B2 * | 10/2008 | Moeckly et al. | ............... | 505/470 |
| 8,022,012 B2 * | 9/2011 | Moeckly et al. | ............... | 505/470 |
| 2004/0107799 A1 * | 6/2004 | Rauch et al. | ..................... | 75/600 |
| 2004/0163948 A1 * | 8/2004 | Fukunaga et al. | ......... | 204/228.7 |
| 2007/0121124 A1 * | 5/2007 | Nabatova-Gabain et al. | | 356/630 |
| 2009/0320757 A1 * | 12/2009 | Wang | ............................ | 118/727 |
| 2011/0315078 A1 * | 12/2011 | Liao et al. | ..................... | 118/694 |
| 2012/0006267 A1 * | 1/2012 | Pei | ............................. | 118/723 R |
| 2012/0037075 A1 * | 2/2012 | Pei | ................................. | 118/696 |
| 2012/0090542 A1 * | 4/2012 | Ruby et al. | ..................... | 118/712 |
| 2012/0186522 A1 * | 7/2012 | Adachi et al. | ................. | 118/726 |

* cited by examiner

*Primary Examiner* — Dah-Wei Yuan
*Assistant Examiner* — Karl Kurple
(74) *Attorney, Agent, or Firm* — Altis Law Group, Inc.

(57) ABSTRACT

An apparatus for processing coating material includes a crucible having a receptacle for receiving coating material, a drive member having a drive shaft, a cover coupled to the drive shaft, and a monitor system including a light source and a camera module. The cover includes a flat surface, a slot defined in the flat surface, a first through hole and a second through hole respectively communicating with opposite ends of the slot. The drive shaft drives the cover to rotate between a closed position where the cover covers the receptacle, and the flat surface presses and flattens the coating material, and an open position where the cover is moved away from the receptacle. The light source is for emitting light through the first through hole to illuminate the coating material. The camera module is for capturing images of the illuminated coating material through the second through hole.

19 Claims, 5 Drawing Sheets

CRUCIBLE HAVING A MONITOR SYSTEM AND A COVER WITH A SLOT WHICH RECEIVES LIGHT FOR ILLUMINATING COATING MATERIAL

BACKGROUND

1. Technical Field

The present disclosure relates to an apparatus for processing coating material and an evaporation deposition device using the apparatus.

2. Description of Related Art

Evaporation deposition device typically includes a coating chamber, a crucible and a carrier positioned in the coating chamber. The crucible is for containing powdery coating materials. The carrier is for supporting workpieces, and keeping the workpieces in opposition to the crucible. In order to keep a stable evaporation rate during the coating process, the surface of the coating material should be smoothed before evaporation. Therefore, the powdery coating materials in the crucible need to be heated by high-energy electron beam. Then the melted once powdery coating materials are compacted manually and cooled into an integral coating material with a smooth surface.

However, the coating materials may be polluted when they are compacted manually. Besides, it's difficult to monitor the status of the powdery coating materials, particularly during the heating procedure.

Therefore, an apparatus for processing coating material which can overcome the above-mentioned problems is desired.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

Embodiments will now be described in detail below with reference to the drawings.

Figure 1:
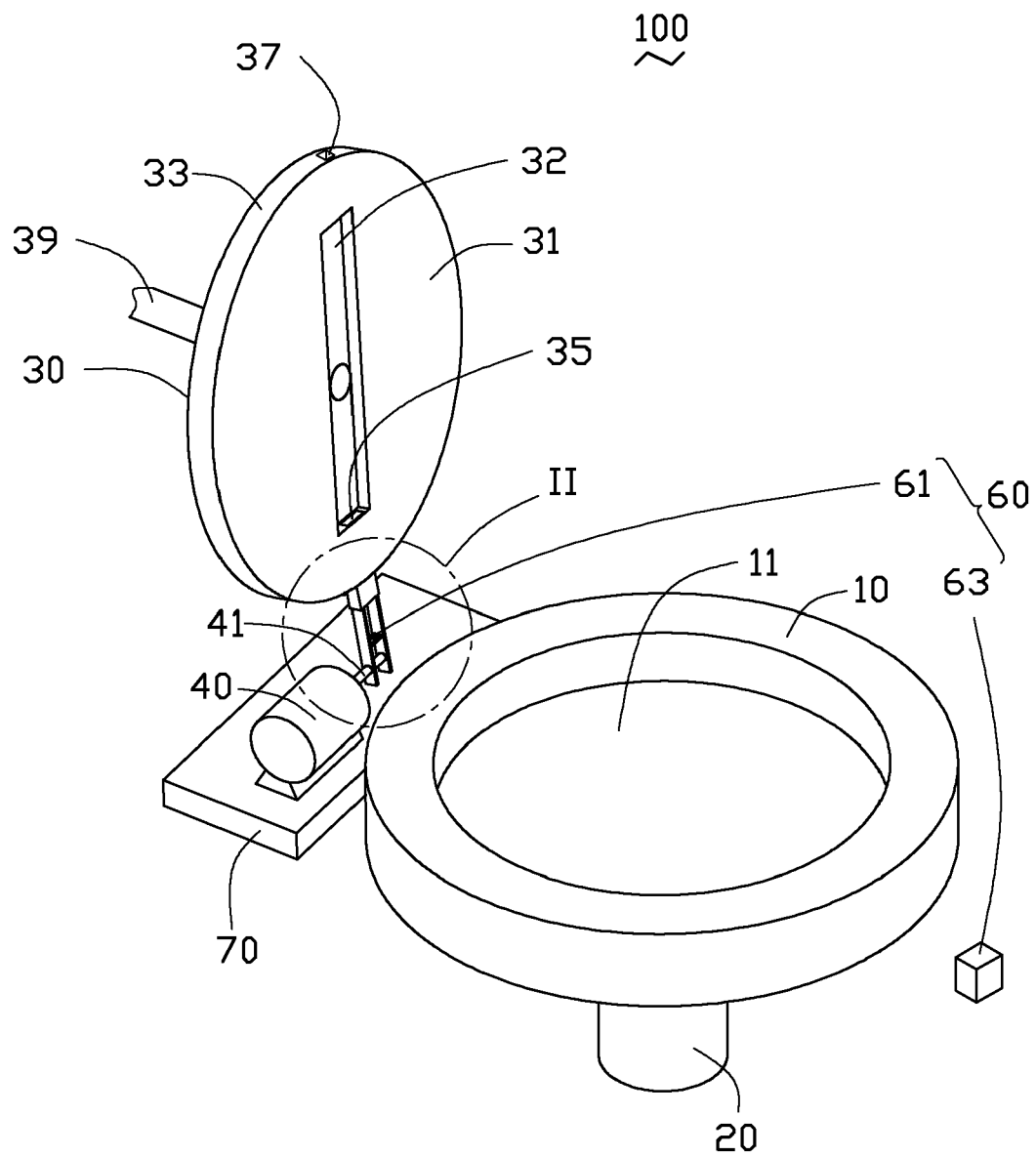
FIG. 1 is an isometric view of an apparatus for processing coating material according to a first embodiment.
Figure 2:
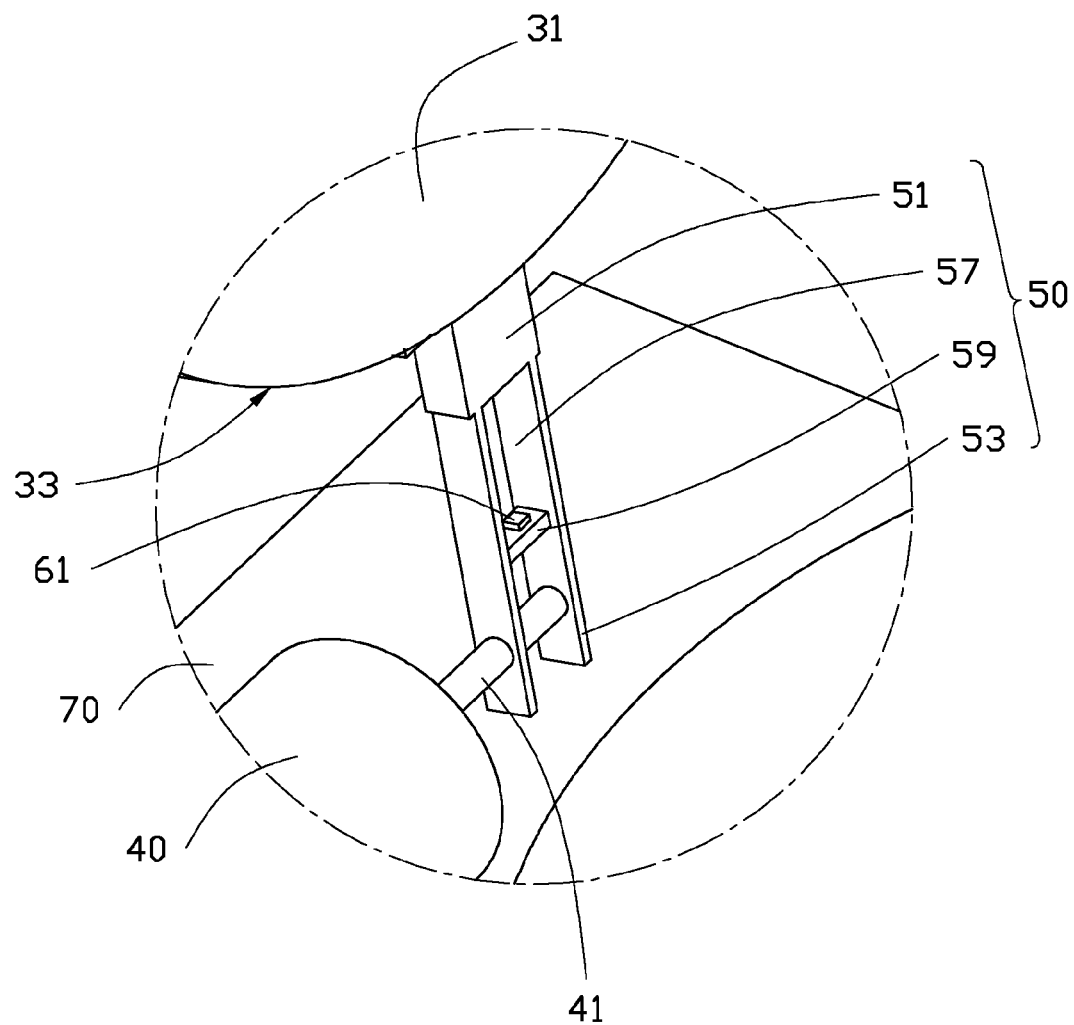
FIG. 2 is an enlarged view of a circled portion II of the apparatus of FIG. 1.

Referring to FIG. 1 to FIG. 2, an apparatus 100 for processing coating material in accordance with a first embodiment is provided. The apparatus 100 includes a crucible 10, a rotating shaft 20, a cover 30, a drive member 40, a connection arm 50, and a monitor system 60.

The crucible 10 has a receptacle 11 for receiving the coating material. In this embodiment, the crucible 10 is made of tantalum, molybdenum, tungsten, or other thermally conductive metal or their alloys. The receptacle 11 is cylindrical. In alternative embodiments, the receptacle 11 may be cubic.

The rotating shaft 20 is coupled with the crucible 10. In this embodiment, the rotating shaft 20 is in the center area of the bottom of the crucible 10. The rotating shaft 20 is coaxial to the receptacle 11.

The rotating shaft 20 may be coupled with a motor.

Figure 3:
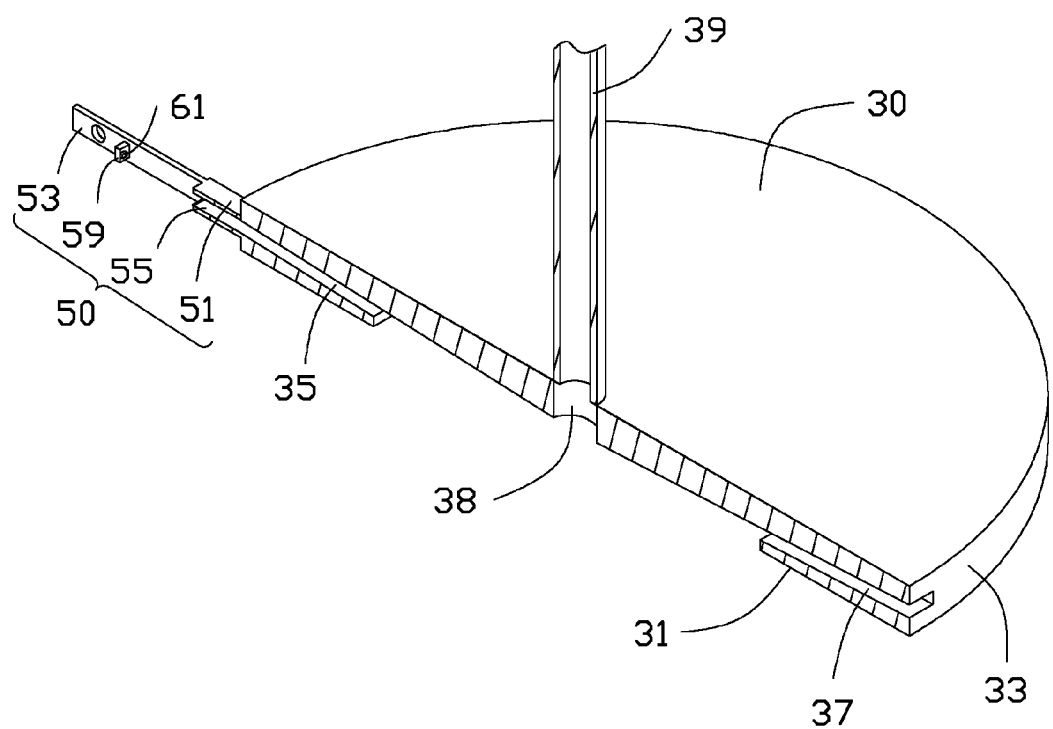
FIG. 3 is a cutaway view of the cover of the apparatus of FIG. 1.

Referring to FIG. 1 and FIG. 3, the cover 30 includes a flat surface 31, a slot 32, a side surface 33, a first through hole 35, and a second through hole 37. The flat surface 31 is to press against the coating material received in the receptacle 11, and flatten the coating material. The shape of the flat surface 31 matches with the shape of the receptacle 11. Therefore, in the present embodiment, the flat surface 31 is circular. The slot 32 is defined in the flat surface 31. Each of the first through hole 35 and the second through hole 37 is defined in the side surface 33 of the cover 30. The first through hole 35 and the second through hole 37 communicate respectively with opposite ends of the slot 32.

In this embodiment, the cover 30 is cylindrical. The slot 32 is defined along the diametrical direction of the flat surface 31. The side surface 33 links the two opposite circular surfaces. The flat surface 31 is one of the two opposite circular surfaces. The diameter of the flat surface 31 is equal to the diameter of the cover 30. The diameter of the flat surface 31 is less than the diameter of the receptacle 11. The first through hole 35 and the second through hole 37 are respectively positioned on two opposite portions of the side surface 33 (shown in FIG. 3). Each of the first through hole 35 and second through hole 37 is obliquely oriented relative to the flat surface 31 and extends inwardly and downwardly from the side surface 33 of the cover 30 to the slot 32. The extension direction of the first through hole 35 and the extension direction of the second through hole 37 intersect each other. The length of the slot 32 is substantially equal to the diameter of the flat surface 31. The oblique angle of the first through hole 35 relative to the diametrical direction is equal to the oblique angle of the second through hole 37 relative to the diametrical direction. The first through hole 35 and second through hole 37 are substantially located on a common plane. The central axis of the first through hole 35 and the central axis of the second through hole 37 intersect the central axis of the cover 30 at the same point.

Further, the wall of the first through hole 35 and the wall of the second through hole 37 are respectively coated with a reflective film.

Further, the apparatus 100 includes a pipe 39, the cover 30 has a vent 38. The vent 38 extends through the cover 30 along the axis of the cover 30. The vent 38 communicates with the pipe 39 and the slot 32. In this embodiment, the pipe 39 is substantially perpendicular to the flat surface 31.

The drive member 40 drives the cover 30 to press and flatten coating material in the receptacle 11 of the crucible 10. The drive member 40 has a drive shaft 41. The drive shaft 41 is coupled with the cover 30. Therefore, the drive member 40 can drive the cover 30 to rotate around the drive shaft 41 between a closed position and an open position. When the cover 30 is in the closed position, the cover 30 covers the receptacle 11 with the slot 32 disposed along a diametrical direction of the receptacle 11 and aligned with the receptacle 11 along a central axis of the receptacle 11. Then the flat surface 31 presses against the coating material to flatten the coating material. When the cover 30 is in the open position, the cover 30 is moved away from the receptacle 11.

In this embodiment, the drive shaft 41 is substantially perpendicular to the central axis of the receptacle 11 and the lengthwise direction of the slot 32. The distance between the central axis of the drive shaft 41 and the central axis of the receptacle 11 is equal to the distance between the central axis of the cover 30 and the central axis of the drive shaft 41. The central axis of the receptacle 11 is tangent to the path of the central axis of the cover 30 rotates around the drive shaft 41.

The connection arm 50 has a connection end 51 and a coupling end 53. The coupling end 53 is opposite to the connection end 51. The connection end 51 is on the side surface 33 where the first through hole 35 is defined. The coupling end 53 is coupled with the drive shaft 41 of the drive member 40.

In this embodiment, the connection arm 50 extends along a diametrical direction of the cover 30.

Referring to FIG. 2 and FIG. 3, in this embodiment, the connection arm 50 further has a third through hole 55, an accommodation room 57 and a fixing part 59. The third through hole 55 is positioned in the connection end 51. The third through hole 55 extends along the length of the connection arm 50, and communicates with the first through hole 35. The accommodation room 57 communicates with the third through hole 55. The fixing part 59 is in the accommodation room 57.

In this embodiment, the fixing part 59 is perpendicular to the connection arm 50, and is located between the connection end 51 and the drive shaft 41 of the drive member 40.

Figure 4:
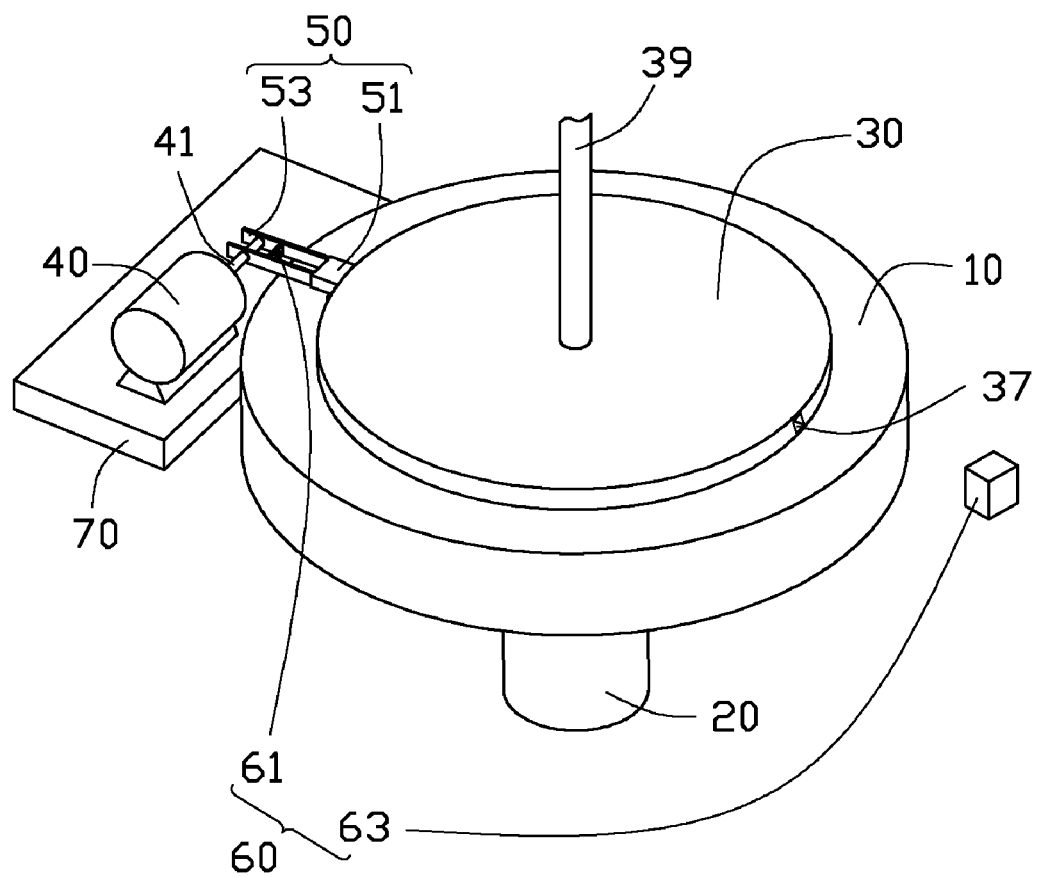
FIG. 4 is a schematic view of the apparatus of FIG. 1 in a closed position.

Referring to FIG. 1 and FIG. 4, the monitor system 60 includes a light source 61 and a camera module 63. The light source 61 is configured for emitting light through the third through hole 55 and the first through hole 35 to illuminate the coating material received in the receptacle 11. In this embodiment, the light source 61 is accommodated in the accommodation room 57 of the connection arm 50, and is secured on the fixing part 59. The light source 61 is positioned in the extension direction of the third through hole 55, and faces the third through hole 55. The camera module 63 is configured for capturing images of the illuminated coating material through the second through hole 37. In this embodiment, the camera module 63 is located in a position opposite to the second through hole 37. When the cover 30 closes the receptacle 11, the camera module 63 is in the extension direction of the second through hole 37, and faces the second through hole 37.

Furthermore, the coating material processing apparatus 100 includes a conveyer part 70. The drive member 40 coupled with the cover 30 is on the conveyer part 70. With the conveyer part 70, the drive member 40 and the cover 30 can move forward or backward along diametrical direction of the crucible 10, therefore, the distance between the crucible 10 and the drive shaft 41 can be adjusted.

Referring to FIG. 3 and FIG. 4, in operation, the cover 30, covers the receptacle 11 of the crucible 10. The flat surface 31 opposes the receptacle 11. The flat surface 31 can press and flatten the coating materials received in the receptacle 11. The light rays from the light source 61 transmit into the third through hole 55, and enter the slot 32 through the first through hole 35, illuminate the coating material received in the receptacle 11. Then, the light rays are reflected by the coating material in the receptacle 11, and captured by the camera module 63 through the second through hole 37. The camera module 63 can form an image of the coating material. Therefore, the status of the coating material in the receptacle 11 can be monitored. Air in the powdery coating materials can be vented out of the receptacle 11 through the pipe 39.

In this embodiment, the dimension of the first through hole 35 is constant. In alternative embodiments, the dimension of the first through hole 35 may increase from the side surface 33 to the slot 32 along the extension direction of the first through hole 35. Likewise, the dimension of the second through hole 37 can increase from the side surface 33 to the slot 32 along the extension direction of the second through hole 37.

In this embodiment, the drive member 40 is coupled with the connection arm 50 directly. In alternative embodiments, a transmission mechanism, such as gear transmission mechanism, may be coupled with the drive member 40 and the connection arm 50.

The first through hole 35 and the second through hole 37 can be defined on the surface opposite to the flat surface 31. The light source 61 can be secured in the first through hole 35. The camera module 63 can be secured in the second through hole 37. The light source 61 can be a light-emitting diode, or an infrared light source.

Figure 5:
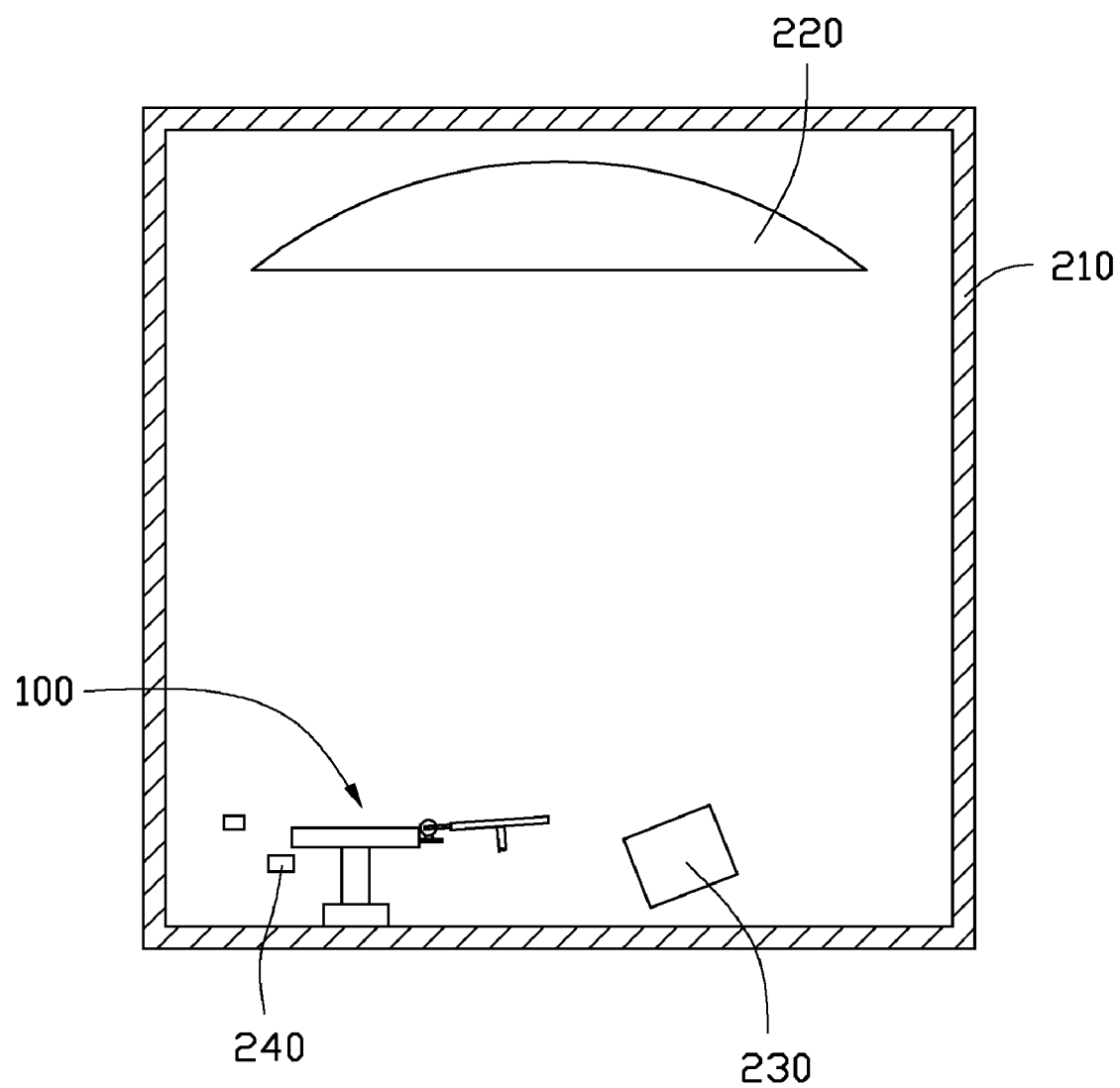
FIG. 5 is an isometric view of an evaporation deposition device according one exemplary embodiment.

Referring to FIG. 5, an evaporation deposition device 200 in accordance with an alternative embodiment is provided. The evaporation deposition device 200 includes a coating chamber 210, a carrier 220, a plasma source 230, a heating system 240, and a coating material processing apparatus 100.

The coating chamber 210 is a vacuum chamber. All of the following, the carrier 220, the plasma source 230, the heating system 240 and the apparatus 100 are in the coating chamber 210.

The carrier 220 is for supporting workpieces, and keeping the workpieces opposing the crucible 10 (not labeled in the FIG. 5) of the apparatus 100. The plasma source 230 is used to form plasma in the coating chamber 210. In this embodiment, the heating system 240 is an electron gun, used to form high-energy electron beam to heat the coating materials to vaporize the coating material. Finally, the resultant materials are deposited onto the workpieces.

In this embodiment, the carrier 220 is on the top of the coating chamber 210, and above the apparatus 100. The plasma source 230 is below the carrier 220, and faces the carrier 220. The crucible 10 of the apparatus 100 opposes the carrier 220. The heating system 240 is beside the crucible 10.

It is to be understood that an image analyzer and an image display can be located outside the coating chamber 210, and electrically connect with the camera module 63 of the apparatus 100.

Due to the rotatable cover 30 combined with the monitor system 60, the apparatus 100 can process the powdery coating materials into an integral coating material with a smooth surface automatically. Thus, the apparatus 100 can greatly reduce the possibility of the coating material being polluted manually. Besides, the apparatus 100 can capture images of the coating materials. Thus, the status of the coating materials can be monitored. It may be helpful for controlling the heating procedure.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. An apparatus for processing coating material, comprising:
    a crucible having a cylindrical receptacle for receiving coating material therein;
    a drive member comprising a drive shaft;
    a cover coupled to the drive shaft, the cover including a flat surface, a slot defined in the flat surface, a first through hole and a second through hole, the first through hole and the second through hole respectively communicating with opposite ends of the slot, the drive shaft configured to drive the cover to rotate thereabout between a closed position where the cover covers the receptacle with the slot disposed along a diametrical direction of the receptacle and aligned with the receptacle along a central axis direction of the receptacle, and the flat surface presses against the coating material to flatten the coating material, and an open position where the cover is moved away from the receptacle; and a monitor system comprising a light source facing the first through hole, configured to emit light through the first through hole to illuminate the coating material received in the receptacle, and a camera module facing the second through hole, configured to capture images of the illuminated coating material through the second through hole.

2. The apparatus of claim 1, wherein each of the first and second through holes is obliquely oriented relative to the flat surface and extends inwardly and downwardly from a peripheral side surface of the cover to the slot.

3. The apparatus of claim 1, wherein the slot has a length equal to an inner diameter of the receptacle.

4. The apparatus of claim 2, wherein the drive shaft is perpendicular to a lengthwise direction of the slot.

5. The apparatus of claim 1, wherein the crucible comprises a connection arm coupled to the drive shaft, wherein the light source is mounted on the connection arm and aligned with the first through hole.

6. The apparatus of claim 2, wherein the crucible is rotatable about the central axis of the receptacle.

7. The apparatus of claim 6, wherein the first and second through holes are substantially located on a common plane.

8. The apparatus of claim 2, further comprising a pipe perpendicular to the flat surface, the pipe located at an opposite side of the cover to the slot, the pipe communicating with the slot.

9. The apparatus of claim 1, wherein both the crucible and the cover are made of thermally conductive metal.

10. An evaporation deposition device, comprising:
a coating chamber; and
an apparatus for processing coating material arranged in the coating chamber, the apparatus comprising:
a crucible having a cylindrical receptacle for receiving coating material therein;
a drive member comprising a drive shaft;
a cover coupled to the drive shaft, the cover including a flat surface, a slot defined in the flat surface, a first through hole and a second through hole, the first through hole and the second through hole respectively communicating with opposite ends of the slot, the drive shaft configured to drive the cover to rotate thereabout between a closed position where the cover covers the receptacle with the slot disposed along a diametrical direction of the receptacle and aligned with the receptacle along a central axis direction of the receptacle, and the flat surface presses against the coating material to flatten the coating material, and an open position where the cover is moved away from the receptacle; and a monitor system comprising a light source facing the first through hole, configured to emit light through the first through hole to illuminate the coating material received in the receptacle, and a camera module facing the second through hole, configured to capture images of the illuminated coating material through the second through hole.

11. The evaporation deposition device of claim 10, further comprising a support for supporting workpieces thereon, a plasma source facing the support, and a heating system for heating the coating material; wherein the support, the plasma source and the heating system are received in the coating chamber.

12. The evaporation deposition device of claim 10, wherein each of the first and the second through holes is obliquely oriented relative to the flat surface and extends inwardly and downwardly from a peripheral side surface of the cover to the slot.

13. The evaporation deposition device of claim 10, wherein the slot has a length equal to an inner diameter of the receptacle.

14. The evaporation deposition device of claim 12, wherein the drive shaft is perpendicular to a lengthwise direction of the slot.

15. The evaporation deposition device of claim 10, wherein the crucible comprises a connection arm coupled to the drive shaft, wherein the light source is mounted on the connection arm and aligned with the first through hole.

16. The evaporation deposition device of claim 12, wherein the crucible is rotatable about the central axis of the receptacle.

17. The evaporation deposition device of claim 16, wherein the first and second through holes are located on a common plane.

18. The evaporation deposition device of claim 12, further comprising a pipe perpendicular to the flat surface, the pipe located at an opposite side of the cover to the slot, the pipe communicating with the slot.

19. The evaporation deposition device of claim 10, wherein both the crucible and the cover are made of thermally conductive metal.

* * * * *